United States Patent
Eaton, Jr. et al.

(10) Patent No.: US 7,376,004 B2
(45) Date of Patent: May 20, 2008

(54) INCREASED MAGNETIC MEMORY ARRAY SIZES AND OPERATING MARGINS

(75) Inventors: James R. Eaton, Jr., Palo Alto, CA (US); Frederick A. Perner, Palo Alto, CA (US); Lung T. Tran, Saratoga, CA (US); Kenneth J. Eldredge, Boise, ID (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 896 days.

(21) Appl. No.: 10/661,448

(22) Filed: Sep. 11, 2003

(65) Prior Publication Data
US 2005/0094458 A1 May 5, 2005

(51) Int. Cl.
*G11C 11/00* (2006.01)
*G11C 11/14* (2006.01)

(52) U.S. Cl. .................. 365/158; 365/171; 365/173

(58) Field of Classification Search .............. 365/158, 365/171, 173
See application file for complete search history.

(56) References Cited

U.S. PATENT DOCUMENTS

| | | | | |
|---|---|---|---|---|
| 6,130,835 A * | 10/2000 | Scheuerlein | ............... | 365/171 |
| 6,567,300 B1 * | 5/2003 | Raberg et al. | ............... | 365/173 |
| 6,636,436 B2 * | 10/2003 | Perner | ........................ | 365/158 |
| 6,704,220 B2 * | 3/2004 | Leuschner | ................... | 365/173 |
| 6,826,079 B2 * | 11/2004 | Tran | ........................... | 365/171 |
| 6,873,561 B2 * | 3/2005 | Ooishi | ........................ | 365/158 |
| 6,885,573 B2 * | 4/2005 | Sharma et al. | ............. | 365/158 |
| 6,897,101 B2 * | 5/2005 | Weitz | ......................... | 438/171 |
| 6,930,915 B2 * | 8/2005 | Lammers et al. | ........... | 365/171 |
| 7,046,545 B2 * | 5/2006 | Hosotani | .................... | 365/158 |

* cited by examiner

*Primary Examiner*—Trong Phan
(74) *Attorney, Agent, or Firm*—Myers Bigel Sibley & Sajovec, P.A.

(57) ABSTRACT

A method for making magnetic random access memories (MRAM) isolates each and every memory cell in an MRAM array during operation until selected. Some embodiments use series connected diodes for such electrical isolation. Only a selected one of the memory cells will then conduct current between respective ones of the bit and word lines. A better, more uniform distribution of read and data-write data access currents results to all the memory cells. In another embodiment, this improvement is used to increase the number of rows and columns to support a larger data array. In a further embodiment, such improvement is used to increase operating margins and reduce necessary data-write voltages and currents.

6 Claims, 1 Drawing Sheet

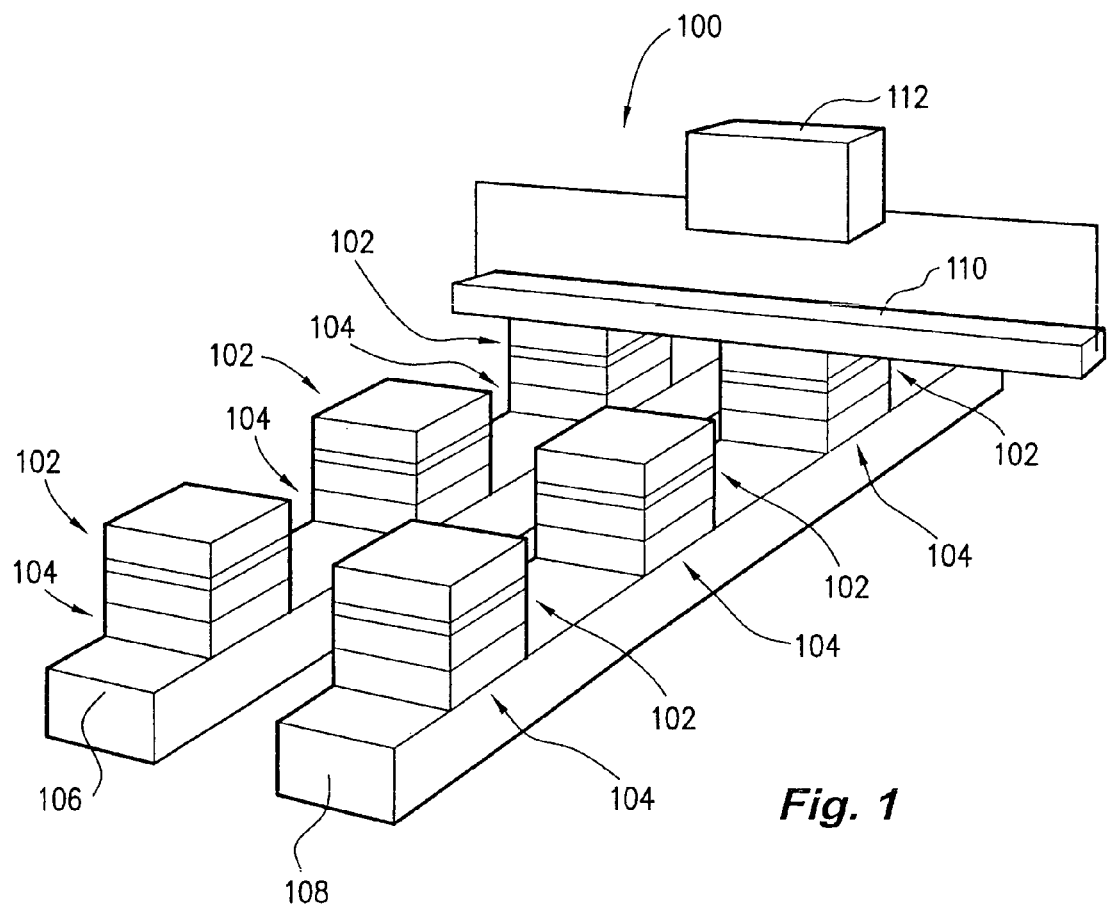
*Fig. 1*
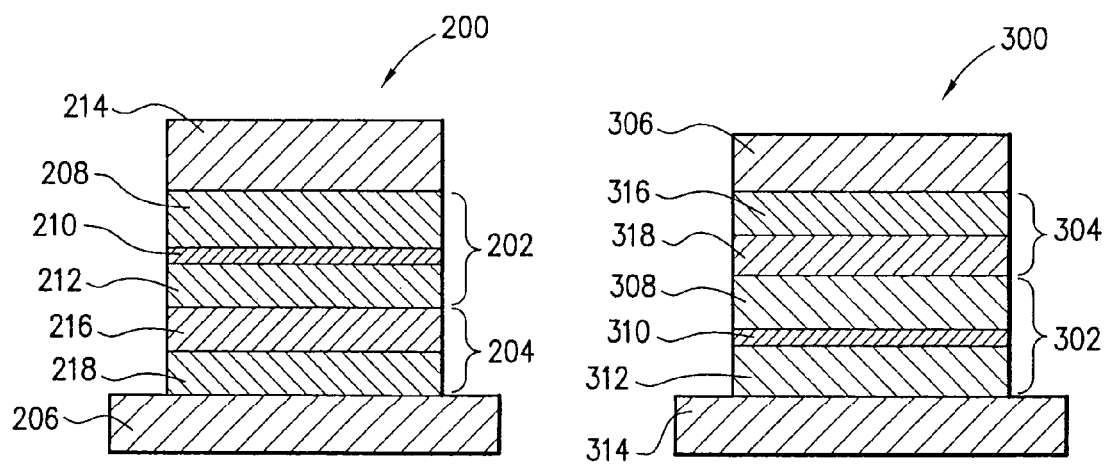
*Fig. 2*  *Fig. 3*

INCREASED MAGNETIC MEMORY ARRAY SIZES AND OPERATING MARGINS

FIELD OF THE PRESENT INVENTION

The present invention relates to magnetic memory device arrays, and more specifically to techniques and circuits for increasing the practical size of such arrays.

BACKGROUND OF THE PRESENT INVENTION

High-density, high-speed, non-volatile, low-power, and low-cost are common goals shared by many memory devices. But all these cannot be realistically obtained in practice, and some trade-offs are inevitable. The particular applications dictate which way the compromises should be made. For example, static random access memory (SRAM) is fast, but usually comes at the cost of lower density. Such is useful in CPU-cache memory applications. Dynamic random access memory (DRAM) is high density, but is not non-volatile. So DRAM is usually used in main memory applications for general purpose computers.

Newer memory types like magnetic random access memory (MRAM) are inherently non-volatile, but still have to find compromises between density, access speed, etc. Three types of MRAM have been developed based on different magnetic phenomenon, e.g., anisotropic, giant, and tunneling magneto resistance.

The tunneling magneto resistance type of MRAM is of interest here. A cross-point array of magnetic tunneling junction (MJT) memory cells allows direct addressing. Each cell appears as a resistance that depends on the digital data value being stored.

The conventional MJT memory cell comprises two magnetic layers separated by an electrical insulator. The insulator is so thin that it is subject to tunneling currents between the magnetic layers it contacts. Such tunnel currents appear as an electrical resistance that depends on the magnetic field that cuts through the insulator. The upper and lower magnetic layers are deposited as ellipsoids so that their magnetizations will occur in one of two preferred directions, e.g., longitudinal with the ellipsoid.

The lower magnetic layer is fabricated with a high coercitivity material and is permanently magnetized in a set direction during an annealing process step. The upper magnetic layer comprises a lower coercitivity material and is flip-flopped in its magnetic direction by column and row data-write currents that agree at the targeted cross-point array intersection.

The magnetic field experienced by the insulator sandwiched in between the upper and lower magnetic layers will be in one of two states, a first where both magnetic directions are the same, and a second where the magnetic directions are opposite. The magnetic field affects the ease with which tunneling electrons with spin can punch or tunnel through the insulator. So the state of the upper magnetic "data" layer can be read by measuring the apparent electric resistance across the insulator.

Hewlett-Packard MRAM technology includes cross-point arrays of MJT cells in which differential measurements of each MJT cell's electrical resistance are measured. If the reading causes the upper magnetic layer magnetic direction to flip, a current is generated that can be sensed. Such then allows a data-write cycle to be generated that restores the bits disturbed during an "equipotential" read cycle.

Building large arrays of memory cells has been a problem because the data-write currents seen by particular cells can be reduced by spurious leakage paths through non-selected cells. The bit lines and word lines connect to rows and columns of memory cells, and it is the memory cell at the intersection of the selected bit line and selected word line that is intended to receive all the data-write current. But other memory cells laying on a selected bit line, or on a selected word line can participate in a leakage path that serpentines through multiple memory cells in series. Each memory cell appears as a programmable resistance, and these can load the individual bit lines and word lines. The practical effect is such bit and word lines are limited in length and thus the size of the array is also limited. Another effect is the operating margins are reduced.

What is needed is a circuit to limit or control such leakage currents so the bit and word lines are not so loaded and larger arrays can be fabricated.

SUMMARY OF THE PRESENT INVENTION

Briefly, a magnetic random access memory (MRAM) embodiment of the present invention includes magnetic memory cells for switching between two states on the application of an electromagnetic field to selected ones of the cells. The magnetic memory cells are connected to electrically conductive lines for carrying data-write currents. The MRAM includes a plurality of diodes each connected to a respective magnetic memory cell. Such diodes limit current leakage through non-selected ones of the magnetic memory cells.

The present invention will be more fully understood from the following description of an embodiment of the present invention. The description is provided with reference to the accompanying drawings.

BRIEF DESCRIPTION OF THE DRAWINGS

FIG. 1 is a perspective diagram of a magnetic random access memory array embodiment of the present invention;

FIG. 2 is a cross sectional diagram of a magnetic memory device in which the leakage-blocking diodes are beneath the MRAM cells adjacent to the word lines; and FIG. 3 is a cross sectional diagram of a magnetic memory device in which the leakage-blocking diodes are atop the MRAM cells near the bit lines.

DETAILED DESCRIPTION OF THE EMBODIMENTS

FIG. 1 represents a magnetic random access memory (MRAM) array embodiment of the present invention, and is referred to herein by the general reference numeral 100. The MRAM 100 includes an array of magnetic memory cells 102 and leakage-blocking diodes 104 in a cross-point arrangement. Each memory cell 102 is based on tunneling magneto resistance (TMR) technology in which a dielectric layer uses tunneling currents affected by local magnetic fields. Individual cells 102 are selectively addressed for read-write access by word lines 106 and 108, and bit lines 110. These bit and word lines represent hundreds of such lines that constitute and implement the cross-point array.

Memory cells at the intersection of selected bit and word lines will receive data-write currents. The delivered current is a function of the applied voltage and the path resistance it sees. A minimum current is needed to data-write data to any cell, and the excess current available to such cell is its operating margin. But too high a voltage or current can data-write unintended data to non-selected cells. Too low a voltage or current can result in random or constant failures to data-write data to selected cells.

The leakage-blocking diodes 104 reverse bias and prevent spurious currents from flowing in non-selected ones of cells 104. Various kinds of diodes and transistors can be used here to do this. Diodes 104 may be Shottky or other diode types. Transistors could also be used to control leakage currents through unintended paths in the memory array. In this example, individual diodes 104 are series connected with cells 102 between respective word and bit lines.

When a data-write current is applied to bit line 110, a magnetic field will surround it. Such is used to switch the magnetic memory cells 102 by flipping the permanent-magnet data layer to the opposite polarization. Binary information can therefore be stored as a function of the direction of the magnetic field generated by the current applied to bit line 110.

Spurious current paths can exist through multiple ones of the magnetic memory cells in an array. A portion of a data-write current which is directed through a selected row or column will usually also leak through opportunist paths that serpentine around selected bit and word lines. These currents may then leak across the array. Since the distribution of such currents is not predictable, it is also not uniform across the array. The data-write current that a selected magnetic memory cell actually experiences is a function of its position within the array.

In embodiments of the present invention, diodes 104 block most or all of these spurious leakage paths through non-selected cells in the array. The leakage currents are reduced compared to MRAM's without such diodes. Any non-uniformity of the distributed data-write currents for different magnetic memory cells within the array is also reduced. Such makes it possible to fabricate magnetic memory arrays with larger numbers of cells, and/or better operating margins.

The diodes are selected so that the data-write currents at the position of any selected magnetic memory cell of the array differs less than 10% from that of another selected magnetic memory cell. In order to predict the dependency of the current non-uniformity on the number of rows and columns, the inventors derived equation-1, $$\eta = \sqrt{\frac{R_m * \varepsilon (2 + K_{DR})}{R_r (1 - \varepsilon)}} \qquad \text{Eq. 1}$$

where, $\varepsilon$ is the data-write current non-uniformity, $\kappa$ is the number of rows in a square array and $K_{DR}$ is a constant that depends on the reverse-bias impedance of the diodes. For example, if the desired maximum current non-uniformity is 10%, $\varepsilon$=0.11.

MRAM 100 may be a square array of magnetic memory cells and columns and rows of magnetic memory cells. Theses are interconnected, e.g., by bit line 110 and word lines 106 and 108. In one instance, the resistance of each magnetic memory cell could be $R_m$=1 MΩ and the resistance of each row or column could be $R_r$=113 MΩ. Copper metallizations are used so the wiring resistance is relatively small compared with that of the rows and memory cells.

If the reverse-bias resistance of diodes 104 is ten times larger than the resistance of the magnetic memory cells 102, the constant $K_{DR}$ in Equation-1 is 10.0. Equation-1 indicates that the maximum array size would be 3435-by-3435, given a maximum current non-uniformity of 10% and $\varepsilon$=0.1.

If the array 100 did not include diodes 104, the constant, $K_{DR}$, would be zero, and Equation-1 predicts the maximum array possible would be 1402-by-1402. A similar array without diodes 104 would be limited to a smaller number of rows and columns, and have a data-write current non-uniformity worse than 10%.

FIG. 1 includes a data-write generator 112 that outputs a data-write current through bit line 110. The circuit may also generate a current through word lines 104 and 106. (Electrical connections to the data-write generator 112 are not shown for word lines 106 and 108).

Although not illustrated in FIG. 1, MRAM 100 typically includes a read circuit for sensing the resistance of selected memory cells 102. During read operation, a constant voltage is applied to the bit line 110 and sensed by the read circuit. An external circuit may provide the constant supply voltage.

FIG. 2 represents a magnetic memory device 200, and is similar to a portion of bit line 110, memory cell 102, diode 104, and part of word line 108 (FIG. 1). Device 200 includes a magnetic memory cell 202 and a thin-film diode 204 above a word line 206. The thin-film diode 204 is in electrical series with magnetic memory cell 202 and word line 206.

The magnetic memory cell 202 includes a switchable magnetic "data" layer 208, a thin dielectric tunneling layer 210, and a non-switchable magnetic "reference" layer 212. Data layer 208 is connected underneath to a bit line 214.

Diode 204 includes an n-type region 216 and a p-type region 218 to form a rectifying P-N junction. The n-type and p-type regions are doped amorphous silicon, e.g., with boron for p-type, and with phosphorous or arsenic for n-type. The regions and their contact areas are typically 140 nm×300 nm.

Forward biased, the impedance of the diode is about 10% of what the magnetic memory cell 202 expresses. Reversed biased, the resistance is more than ten times that of the magnetic memory cell 202, e.g., for a voltage range of 0.5-1.0 volts.

Data layer 208 includes nickel iron, the reference layer 212 includes cobalt iron, and the dielectric layer 210 includes aluminum dioxide. All layers have the same planar area of approximately 140 nm by 300 nm, and the reference layer 212 the data layer 208 and the dielectric layer 210 have a thickness of approximately 2.0 nm, 3.5 nm and 1.2 nm. The resistance of the magnetic memory cell 202 is about one megohm. The word and bit lines 206 and 214 include copper metal.

FIG. 3 represents a portion of a magnetic memory device 300 similar to those in FIGS. 1 and 2. Essentially, a leakage-blocking diode is stacked on top of each memory cell, rather than beneath it. A magnetic memory cell 302 is associated with a thin-film diode 304, and both are positioned beneath a bit line 306. The magnetic memory cell 302 includes a data layer 308, a thin tunneling dielectric layer 310, and a magnetic reference layer 312. The thin-film diode 304 includes an n-type region 316, and a p-type region 318.

The magnetic memory cell 302 may include other layers disposed between the magnetic memory cell 302, the diode 304, and the bit line 306. The order of the n-type region and the p-type region may be reversed, depending on the polarities used.

In general, the diodes are selected so that the data-write currents associated with different ones of the magnetic memory cells vary from one another less than 15%, ideally 10% or less.

Each non-linear diode may be connected in series with a respective magnetic memory cell and series connected with a word or bit line and the respective magnetic memory cell. Each non-linear diode is positioned between the bit or word line and the respective magnetic memory cell.

The diodes may be diodes including Shottky diodes and any type of thin-film diodes, but may alternatively be any elements that have current limiting properties that depend on the direction of the current.

Each diode has a reverse-bias impedance that is ten times or larger that the resistance of the each magnetic memory cell. In an alternative embodiment, the resistance of each magnetic memory cell may only be larger than five times or larger than twice the resistance of the magnetic memory cell.

A method embodiment of the present invention electrically isolates each and every memory cell in an MRAM array until selected. Some embodiments use series connected diodes for such electrical isolation. Only a selected one of the memory cells will then conduct current between respective ones of the bit and word lines. A better, more uniform distribution of read and data-write data access currents results to all the memory cells. In one embodiment, this improvement is used to increase the number of rows and columns to support a larger data array. In another embodiment, such improvement is used to increase operating margins and reduce necessary data-write voltages and currents.

Although the present invention has been described with reference to particular examples, those skilled in the art will appreciate it that the present invention may be embodied in many other forms. For example, the magnetic memory cells may be based colossal magneto resistance (CMR) or giant magneto resistance (GMR) technologies.

What is claimed is:

1. A Magnetic Random Access Memory (MRAM) device comprising:
    an array of magnetic memory cells arranged in intersecting rows and columns;
    a plurality of magnetic memory cell selection devices, each of which is coupled to a respective one of the magnetic memory cells in the array to enable selective access to any of the magnetic memory cells during a write operation, wherein a number of the rows included in the array is limited according to the relation:

$$\eta = \sqrt{\frac{R_m * \varepsilon (2 + K_{DR})}{R_r (1 - \varepsilon)}}$$

where $R_m$ comprises a resistance of one of the magnetic memory cells, $\varepsilon$ comprises a maximum current non-uniformity of the array during a write operation, $K_{DR}$ depends on a reverse bias resistance of one of the magnetic memory cell selection devices, and $R_r$ comprises a resistance of a row or column of the magnetic memory cells.

2. The MRAM according to claim 1 wherein the maximum current non-uniformity of the array comprises less than about 15 percent.

3. The MRAM according to claim 1 wherein the magnetic memory cell selection devices comprises diodes or transistors.

4. A method of sizing a MRAM comprising:
    determining a maximum current non-uniformity for the MRAM array to be provided by the array during a write operation wherein a number of rows for inclusion in the array is limited according to the relation:

$$\eta = \sqrt{\frac{R_m * \varepsilon (2 + K_{DR})}{R_r (1 - \varepsilon)}}$$

where $R_m$ comprises a cell resistance of one of magnetic memory cells, $\varepsilon$ comprises a maximum current non-uniformity of the array during a write operation, $K_{DR}$ depends on the reverse bias resistance a magnetic memory cell selection device, and $R_r$ comprises a resistance of a row or column of the magnetic memory cells.

5. The method according to claim 4 wherein the maximum current non-uniformity of the array comprises less than about 15 percent.

6. The method according to claim 4 wherein the magnetic memory cell selection devices comprises diodes or transistors.

* * * * *